United States Patent
Takahashi et al.

[11] Patent Number: 5,571,236
[45] Date of Patent: Nov. 5, 1996

[54] DIAMOND WIRE DRAWING DIE

[75] Inventors: Toshiya Takahashi; Akihiko Ikegaya; Keiichiro Tanabe; Noaji Fujimori, all of Hyogo, Japan

[73] Assignee: Sumitomo Electric Industries, Ltd., Japan

[21] Appl. No.: 112,777

[22] Filed: Aug. 26, 1993

[30] Foreign Application Priority Data

Aug. 28, 1992 [JP] Japan ..................... 3-230362

[51] Int. Cl.⁶ ..................................................... B21C 3/02
[52] U.S. Cl. ..................................................... 72/467
[58] Field of Search ............................ 72/467; 423/446

[56] References Cited

U.S. PATENT DOCUMENTS

| | | | |
|---|---|---|---|
| 4,260,397 | 4/1981 | Bovenkerk | 423/446 |
| 4,333,986 | 6/1982 | Tsuji | 72/467 |
| 4,468,947 | 9/1984 | Takeda | 72/467 |
| 5,387,447 | 2/1995 | Slutz | 423/446 |

FOREIGN PATENT DOCUMENTS

| | | | |
|---|---|---|---|
| 52710 | 3/1988 | Japan | 423/446 |
| 642035 | 1/1979 | U.S.S.R. | 72/467 |

*Primary Examiner*—Daniel C. Crane
*Attorney, Agent, or Firm*—Pennie & Edmonds

[57] ABSTRACT

A wire drawing die comprises first and second polycrystalline diamond layers made of gaseous phase synthesized diamond. The finest diamond particles of the diamond layers are made into the wire contact portion of the die.

5 Claims, 4 Drawing Sheets

DIAMOND WIRE DRAWING DIE

BACKGROUND OF THE INVENTION

1. Technical Field

The present invention relates to a diamond wire drawing die and a process for manufacturing a diamond wire drawing die.

2. Background Art

A drawing die is a tool used for drawing wire, such as a metal wire. Such dies must have enough strength to avoid breakage during drawing, must have superior wear resistance, must be capable of being shaped into an appropriate structure and form, and must have a final die hole surface which provides appropriate drawing conditions.

Diamond, which has all of these properties, is a superior raw material for a wire drawing die. Diamond is the hardest known material and has the highest modulus of elasticity of all known materials. Furthermore, extremely pure diamond has the highest thermal conductivity and the highest transmittance in the infrared spectrum. Thus, diamond is a material for which there are no comparable substitutes with respect to wire drawing dies.

Natural single crystal diamonds, synthesized single crystal diamonds and polycrystalline diamond composites have all been used as a central portion of a wire drawing die. EP 0,391,418 A1 relates to a diamond wire drawing die made of synthesized single crystal diamond provided by the temperature gradient method, and describes a method of producing wire drawing dies by cleaving diamond. However, natural single crystal diamonds and synthesized single crystal diamonds are expensive and are limited in crystal size. Such diamonds are easy to cleave and are prone to breakage.

Polycrystalline diamond composites overcome the faults of single crystal diamonds. A method of synthesizing diamond from a gaseous phase is disclosed in U.S. Pat. No. 4,767,608 issued Aug. 30, 1988 to Matsumoto, et al. Furthermore, U.S. Pat. No. 4,434,188 issued Feb. 28, 1984 to Kano et al. discloses synthesizing diamond from a gaseous phase. With respect to the wire drawing die, a polycrystalline diamond composite is disclosed in U.S. Pat. No. 3,831,428 issued Aug. 27, 1974 Wentorf, Jr. wherein the composite wire drawing die construction is described in which a centrally located mass of diamond defines at least the throat of the wire drawing hole, the mass being flanked or girded by at least one mass of metal bonded carbide that is directly bonded thereto. However, polycrystalline diamonds are limited with respect to wear and heat resistance because they contain sintering aids.

SUMMARY OF THE INVENTION

An object of the present invention is to provide a diamond wire drawing die made of a gaseous phase-synthesized polycrystalline diamond and a process for preparing same.

The present invention provides a high quality diamond wire drawing die comprising a reinforcing mount material and a central portion made of gaseous phase synthesized diamond. The synthesized diamond has the finest diamond particles at the wire contact portion and wire reduction area. The diamond wire drawing die of the present invention can further comprise first and second polycrystalline diamond layers bonded together at a bonding surface. The hole of the die may penetrate the synthesized diamond layers perpendicular to the bonding surface. The hole may also penetrate the synthesized diamond layer such that the center line of the hole is almost parallel to the bonding surface. When the center line of the hole is parallel to the bonding surface, the center line may be located nearby or on the bonding surface. The wire contact portion is a diamond synthesized by the gaseous phase method and the wire contact area, including the reduction portion of the wire drawing die, comprises the finest diamond particles.

The present invention is also directed to a first method of producing the above-described diamond wire drawing die. A first polycrystalline diamond layer is synthesized on a substrate by a gaseous phase synthesizing method. The substrate is then removed. A second polycrystalline diamond layer is synthesized on the surface of the first polycrystalline diamond layer from which the substrate was removed. A hole is provided which penetrates the first and second polycrystalline diamond layers perpendicular to the bonding surface between the first and second polycrystalline diamond layers. The bonded diamond mount material may then be bonded to the mount material.

The present invention is also directed to a second method of producing the diamond wire drawing die described above. A first polycrystalline diamond layer is synthesized on a substrate by a gaseous phase synthesizing method. The substrate is removed. A second polycrystalline diamond layer is synthesized on the surface from which the substrate was removed. A hole is provided parallel to the bonding surface between the first and second polycrystalline diamond layers so that the bonding surface is the center surface of the hole.

It is a feature of either process that the synthesizing direction of the second polycrystalline diamond layer is reverse to the first diamond layer, producing an inverted diamond.

DETAILED DESCRIPTION OF THE INVENTION

Figure 1:
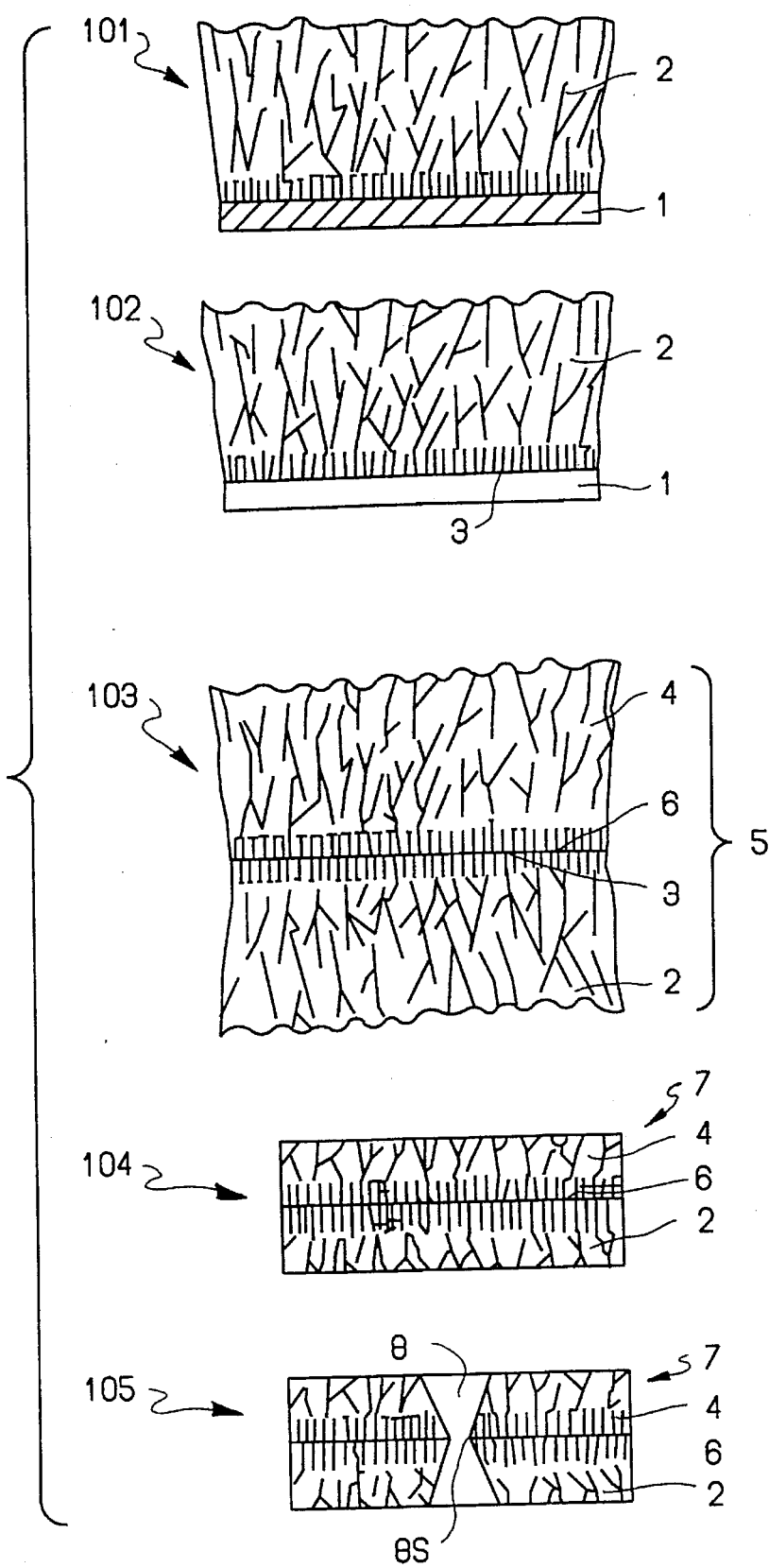
FIG. 1 shows a schematic for a process of making a central portion of a diamond wire drawing die of the present invention.

It is possible to synthesize a diamond using a gaseous phase method. Accordingly, products are now being developed which utilize diamonds made by the gaseous phase method. However, it has not been possible to manufacture a wire drawing die using a diamond made by the gaseous phase method. When used for the reduction portion of a wire drawing die, a diamond synthesized by the gaseous phase cleaves the same way as a single crystal diamond. This is because the diamonds grown by the gaseous phase have a columnar structure of relatively large particle size, which when used for the reduction portion of the wire drawing die easily cleave. Accordingly, the reduction portion of the wire drawing die of a diamond prepared from gaseous phases has been lacking sufficient in strength.

It is possible to a certain extent to control the microstructure of the gaseous phase synthesized diamond by changing the synthesis conditions. However, it is very difficult to make a uniform microstructure of fine particles in the thickness direction.

When a diamond grows on the substrate by the gaseous phase synthesizing method, fiber nuclei develop in the initial stage before forming the film. Although the particle size in the initial stage is markedly influenced by previous substrate treatment and synthesis conditions, it is possible to synthesize the fiber nuclei of a diamond to a diameter of not more than 0.5 µm. The present invention utilizes this phenomenon by producing a high performance diamond wire drawing die using these small particles for the reduction portion of the die.

The diamond wire drawing die of the present invention comprises the synthesized diamond made by gaseous phase method which contacts the wire to be drawn. This diamond material produced by the gaseous phase method has a fine structure and also consists only of diamond. Therefore it has superior wear, heat and chipping-resistance as compared to a polycrystalline diamond composite.

Diamond produced by the gaseous phase method has a fine structure at the initial stage of diamond growth on a substrate and has a tendency to develop more columnar structure and a larger particle size upon forming a film. The diamond wire drawing die of the present invention utilizes this property and so it has finer diamond crystals near the bonding surface of the first and the second polycrystalline diamond layers than at other portions. The further from the bonding surface, the larger the diamond crystals.

Since the portion which has fine diamond crystals at the bonding surface of the first and the second polycrystalline diamond comprises the reduction portion of a die hole, the diamond wire drawing die of the present invention has a hard and cleavage-resistant die hole. Consequently, the diamond wire drawing die has superior wear resistance because the die hole is scarcely scarred by exfoliated diamonds.

Generally, tungsten and molybdenum wires are drawn at high temperature to improve plasticity. However, higher drawing temperature shortens the die life. Since a conventional polycrystalline diamond composite contains binder material, it has inferior heat resistance. However, a gaseous phase synthesized diamond is superior to the polycrystalline diamond composite in heat resistance, because the gaseous phase-synthesized diamond does not contain binder material and has nearly or the same heat conductivity as a natural diamond.

Since the non-diamond ingredient in the gaseous phase synthesized diamond remarkably reduces wear resistance, it is desirable to decrease the content of non-diamond ingredient.

Figure 4:
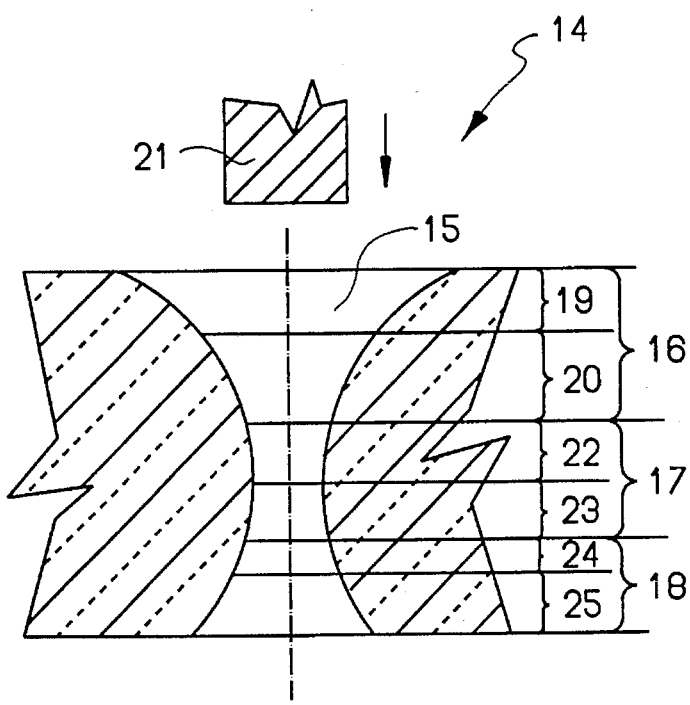
FIG. 4 shows a cross section of an internal structure at the die hole portion of a diamond wire drawing die of the present invention.

FIG. 4 shows a cross-section of an internal structure at the die hole portion of a diamond wire drawing die according to the present invention. As shown in FIG. 4, the internal structure at the hole portion 15 of the central portion 14 of a diamond wire drawing die consists of an entrance portion 16, a reduction portion 17 and an exit portion 18. The entrance portion 16 consists of an entrance part or a bell part 19 and an approach part 20. The entrance part or bell part 19 is the entrance for wire 21 to be drawn, and is provided to allow lubricant to flow easily into the hole. The approach part 20 is provided to inhibit wire vibration, to fix the wire to be drawn, and to allow lubricant to flow easily into the hole. The reduction portion 17 consists of a reduction part 22 and a bearing part 23. The reduction part 22 reduces the wire 21 to be drawn, and is an important part because it influences the property of a wire drawing die and the quality of the drawn wire. The bearing part 23 influences the diameter and surface roughness of the drawn wire. The exit portion 18 consists of a back-relief part 24 and an exit part 25. The back-relief part 24 reinforces the bearing part 23 during wire drawing. The exit part 25 is responsible for threading the hole with the fine tip of the wire 21 before drawing.

Further referring to FIG. 4, a drawing process of the wire 21 is explained hereafter. Initially, the wire 21 to be drawn is threaded with the entrance portion 16. Next, the wire 21 contacts the reduction portion 17 and is plastically deformed into a desired shape, diameter and surface roughness and is then drawn away from the exit portion 18.

The wire 21 is reduced in diameter, and improved in physical properties such as yield strength and surface roughness during this drawing process.

EXAMPLES

Example 1

FIG. 1 shows a schematic diagram for making a diamond wire drawing die according to a preferred embodiment of the present invention. Cross sectional views shown in each of steps 101–105 of FIG. 1, show the crystal structure of gaseous phase synthesized diamond which is used for the present invention. The higher the line density and the shorter the line length, the finer the crystal structure the portion has in each cross-sectional view. The first polycrystalline diamond layer 2 is synthesized on a substrate 1 by the gaseous phase synthesizing method shown at step 101. The first polycrystalline diamond layer 2 is synthesized having a thickness of 500 µm on a Si substrate 1 by hot filament CVD. The synthesis conditions are shown in Table 1.

TABLE 1

| Glass Flow Rate | $CH_4/H_2 = 1.0\%$ |
| --- | --- |
| Pressure | 80 Torr |
| Filament temperature | 2100° C. |
| Substrate temperature | 900° C. |

The substrate 1 is removed in step 102. The Si substrate with the first polycrystalline diamond layer 2 is dipped In hydrofluoric-nitric acid to remove the Si substrate.

In step 103, a 500 µm thick second polycrystalline diamond layer 4 is synthesized by the gaseous phase synthesizing method on the first polycrystalline diamond layer's surface 3 which is the same surface which was adhered to the Si substrate. Thus, a multilayer 5 is constituted. The second polycrystalline diamond layer 4 is synthesized to 500 µm thickness on the side 3 of the first polycrystalline diamond layer by hot filament CVD. The synthesis is carried out under the same conditions as the synthesis of the first polycrystalline diamond layer 2.

In step 104, a multilayer 5 is formed into a central portion 7 having a desired shape and size so that the bonding surface 6 between the first polycrystalline diamond layer 2 and the second polycrystalline diamond layer 4 is horizontal. The central portion 7 is processed by laser machining. In step 105, a die hole 8 is formed in the central portion. The die hole 8 formed by laser machining and ultrasonic machining in the central portion 7 penetrate the first polycrystalline diamond layer and the second polycrystalline diamond layer across the bonding surface 6 of the first polycrystalline diamond layer and the second polycrystalline diamond layer.

As shown in FIG. 1, the central portion 7 of the diamond wire drawing die and the reduction portion 8S of the die hole 8 have the finest structure in the multilayer polycrystalline diamond.

Figure 2:
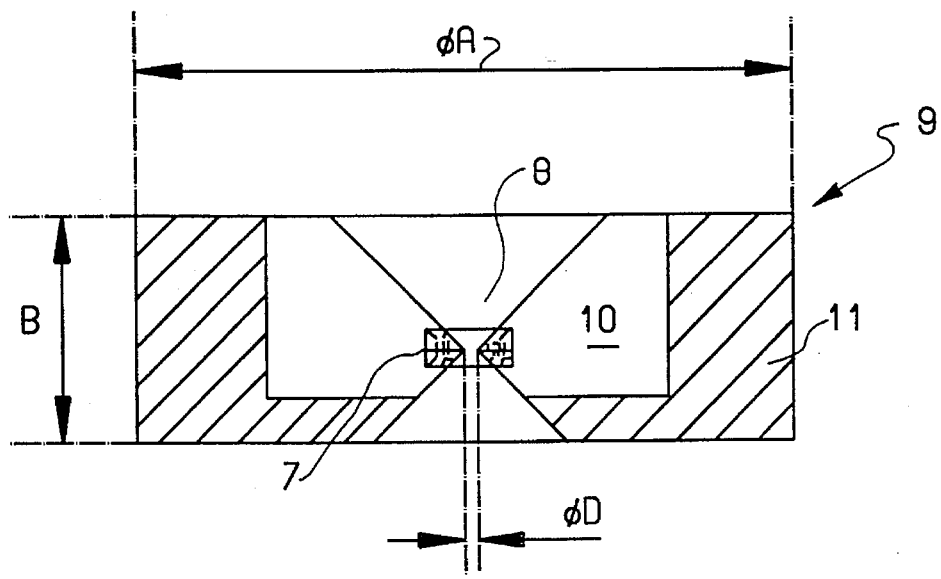
FIG. 2 shows a cross section of a diamond wire drawing die of the present invention.

A diamond wire drawing die of which a cross section is shown in FIG. 2, is provided using the central portion 7 having a die hole 8. As shown in FIG. 2, the diamond wire drawing die 9 is comprised of central portion 7, a reinforcing mount material 10 and the case 11. The central portion 7 is bonded to the reinforcing mount material 10 and the reinforcing material 10 is brazed to the case 11. The specifications of the diamond wire drawing die are shown in Table 2 and 3. The angle in Table 3 is between the drawing direction and a tangent at the middle of each part.

TABLE 2

| Case Dimension | Die hole diameter D (mm) | Outer diameter A (mm) | Height B (mm) |
| --- | --- | --- | --- |
|  | 0.20 | 25 | 10 |

TABLE 3

| Name | Angle (°) | Length (mm) |
| --- | --- | --- |
| Entrance part | 60 | 0.20 |
| Approach part | 30 | 0.13 |
| Reduction part | 15 | 0.12 |
| Bearing part | 0 | 0.10 |
| Back-relief part | 30 | 0.15 |
| Exit part | 50 | 0.30 |

Example 2

Figure 3:
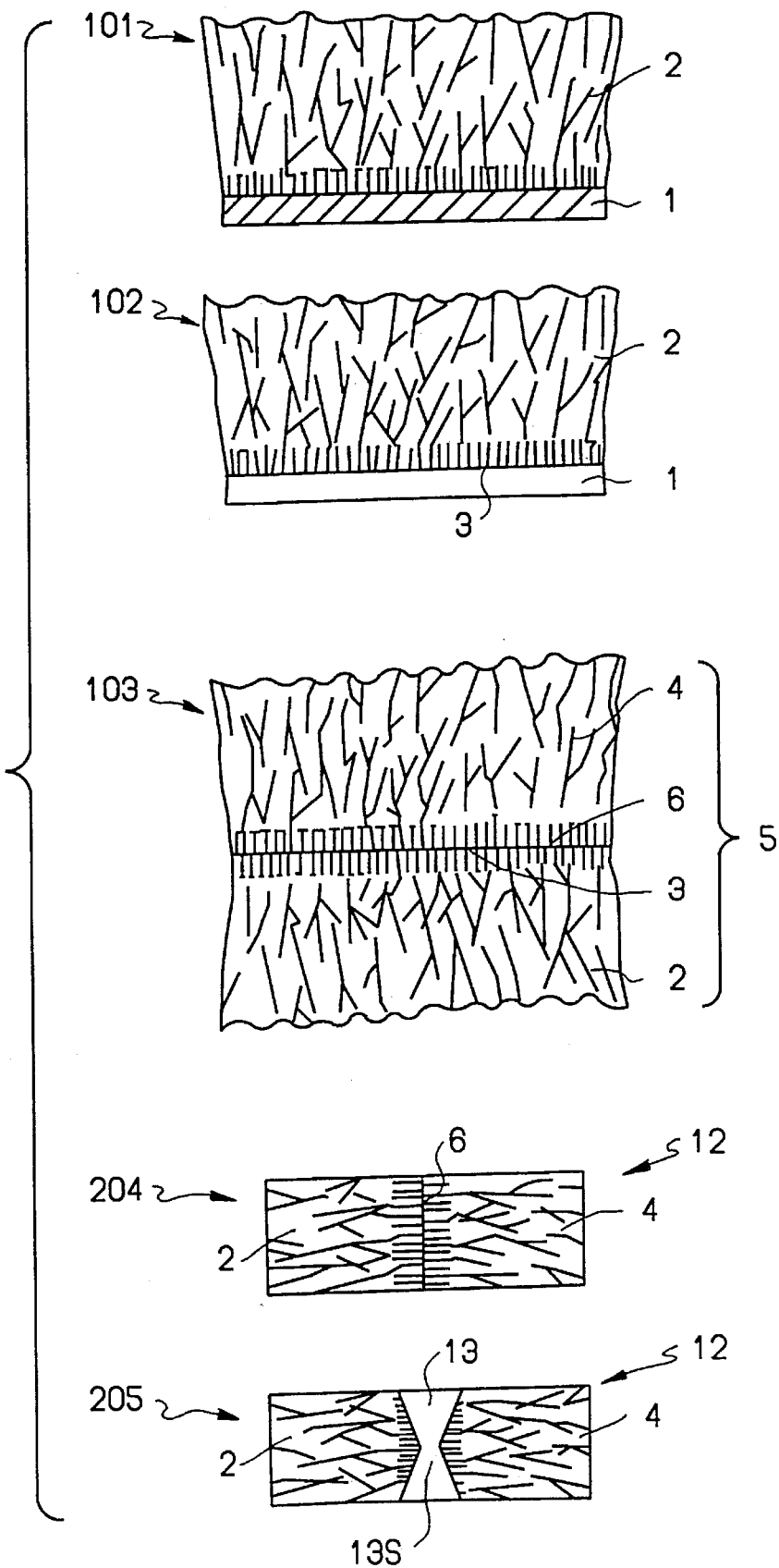
FIG. 3 shows a schematic for another process of making a central portion of a diamond wire drawing die of the present invention.

FIG. 3 shows a diagram of the steps used to produce the diamond wire drawing die of a preferred embodiment of the present invention. Steps 201, 202 and 203 are the same as steps 101, 102 and 103 shown in Fig, 1 described above. However, the difference between step 204 of FIG. 3 and step 104 of FIG. 1 is that the central portion 12 is formed into a desired shape and size so that the bonding surface between the first polycrystalline diamond layer and the second polycrystalline diamond layer is vertical. In step 205, a die hole 13 in the multilayer is formed in a direction parallel to the bonding surface of the first polycrystalline diamond layer 2 and the second polycrystalline diamond layer 4 so that the center of the die hole is located near the bonded surface. The central portion 12 and the reduction portion 13S in the die hole 13 have the finest polycrystalline diamond structure as shown in FIG. 3. The size and the shape of the hole portion 13 have the same specifications as in Example 1. Next, the central portion 12 having the hole portion 13 is made into a diamond wire drawing die as in Example 1.

Comparative Example 1

After a polycrystalline diamond layer having a thickness of 1 mm has been synthesized on a Si substrate by hot filament CVD under the same conditions that the first polycrystalline diamond layer was synthesized in Example 1, the Si substrate is removed. Then, the polycrystalline diamond layer is processed into the central portion of a wire drawing die having a hole portion the same shape and size as the polycrystalline diamond layer in Example 1 using grinding, laser machining and ultrasonic machining. A corresponding diamond wire drawing die as was produced in Example 1 was obtained.

Comparative Example 2

A polycrystalline diamond composite was used as a central portion which had the same shape and size as the polycrystalline diamond layer in Example 1. A diamond wire drawing die corresponding to that of Example 1 is obtained.

Performance tests of the diamond wire drawing dies are carried out under the following conditions to evaluate the diamond wire drawing dies made by the methods of Examples 1 and 2 and Comparative Examples 1 and 2.

The conditions of the first performance test are as follows:

drawing speed : 200 m/min drawn wire : stainless steel reduction in diameter : 0.22 mm →0.20 mm amount of drawn wire : 4 tons The diamond wire drawing dies prepared in Example 1, Example 2 and Comparative Example 2 showed the same results, but the diamond wire drawing die prepared in Comparative Example 1 is chipped. These results show that the diamond wire drawing die of the present invention is superior in strength to the diamond wire drawing die made by a simple gaseous phase synthesized diamond. The reduction portion of the presently invented die is comprised of finer diamond particles compared to that of the simple gaseous phase synthesized diamond layer.

The conditions of the second performance test are as follows:

drawing speed : 300 m/min drawn wire : stainless steel reduction in diameter : 0.22 mm →0.20 mm amount of drawn wire : 5 tons Wear proceeds remarkably in the case of the diamond wire drawing die prepared in comparative Example 2, but those of Examples 1 and 2 have no problem.

These results show that the diamond wire drawing die of the present invention is superior to the diamond wire drawing die made of a polycrystalline diamond composite in heat resistance, because the presently invented die does not contain sintered diamond compact bonding material. Therefore it is possible to improve drawing speed using the presently invented wire drawing die.

Example 3

The first polycrystalline diamond layer is synthesized to be 500 μm in thickness on a Si substrate by hot filament CVD. The Si substrate is then removed. A 500 μm thick second polycrystalline layer is synthesized on the surface of the first polycrystalline diamond layer which is adhered to the substrate before the substrate is removed. A multilayered diamond 1 mm in thickness is obtained.

Figure 5A:
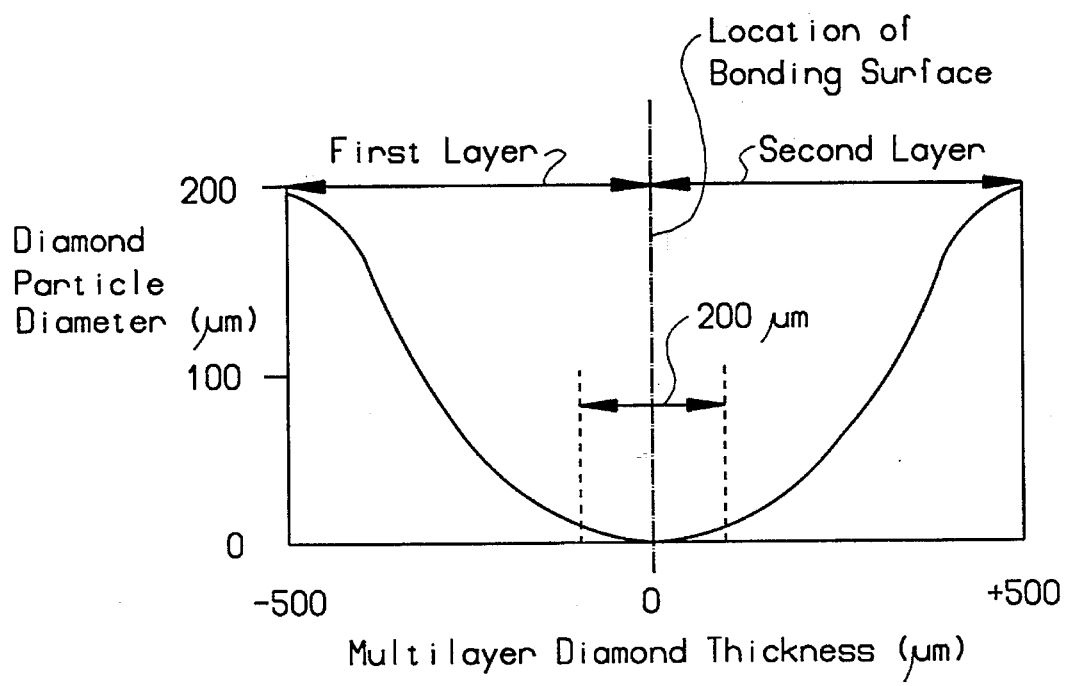
FIGS. 5A and 5B shows a particle size distribution for a diamond wire drawing die of the present invention.
Figure 5B:
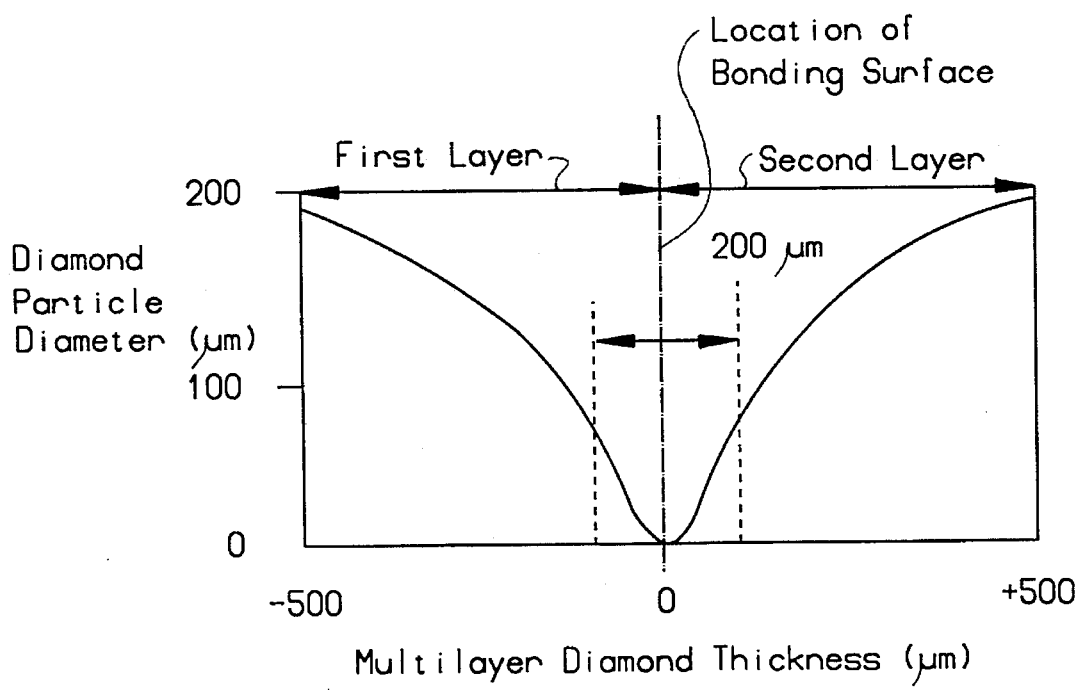

FIG. 5 shows two types of dies (Types A and B) each of which has diamonds produced by varying the synthesis conditions. A particle size of the diamond of Type A is finer in the reduction portion than Type B. These multilayer diamonds are formed to the same specifications as Example 1. The condition of the first performance test is carried out using the diamond wire drawing die made of Types A and B.

The particle size at wire contact portion of Type A was about 5 μm and that of Type B was about 50 μm. The wire drawing die made of Type A had no problem. On the other hand Type B was chipped.

The multilayer diamond having a particle size of not more that 30 μm can be used for the reduction portion for the wire drawing die, preferably not more than 10 μm.

Only the hot filament CVD method was used in Examples 1, 2 and 3 as a gaseous phase synthesizing method. However various kind of low pressure gaseous phase synthesizing methods can be used. For example, the thermal electron emission method, the plasma discharge method, which decomposes and excites material gases, and the flame method can be used in this invention. For instance, a mixture gas which is mainly composed of hydrogen, and a hydrocarbon such as methane, ethane or propane, an alcohol such as methanol or ethanol, or organic carbon compound such as ester, can be used in this invention. Further, the mixture gas may contain noble gases such as argon, or oxygen, carbon monoxide and water to such an extent as not to prohibit the synthesized reaction and not to depress the diamond layer performance. A diamond wire drawing die of the present invention may be employed successfully in drawing noble metal wire such as gold, silver or platinum, and other metal wire such as copper, brass, bronze, brass plated ferrous metal, nickel, stainless steel, tungsten, molybdenum, tin and as a nozzle for chemical fiber and reduction vinyl. In the process to remove the substrate 1 in step 102 of the examples, only the chemical method was used, but since the object of the step 102 is to remove the substrate 1, machining work or any other method may be employed. Since the central portion of the diamond wire drawing die of this invention is composed of gaseous phase synthesized diamond, it is possible to make the finest particle portion of the diamond layer into a reduction portion for example by means of preparing the thickness of the first polycrystalline diamond layer and the thickness of the second polycrystalline diamond layer by changing the gaseous phase synthesizing condition. Since the shape of the hole portion of the wire drawing die depends on the material and the diameter of a wire to be drawn, it is possible to make the finest particle portion of the diamond layer into the wire contact portion of the drawing die.

The foregoing results show that the diamond wire drawing die of the present invention has superior strength, as well as superior wear and heat resistance, thereby extending tool life.

What we claim is:

1. A wire drawing die, comprising a reinforcing mount material and a central portion made of gaseous phase-synthesized diamond through which a die hole runs, wherein
    a) the die hole defines wire contact and reduction areas with the synthesized diamond, and
    b) the synthesized diamond comprises diamond particles, wherein the particles bordering the wire contact and reduction areas are finer than those of which the synthesized diamond otherwise comprised; and wherein the synthesized diamond comprises a first polycrystalline diamond layer and a second polycrystalline diamond layer, said layers being bonded together at a bonding surface.

2. The wire drawing die according to claim 1 wherein the die hole penetrates the synthesized diamond layers in a plane that is perpendicular to the bonding surface.

3. The wire drawing die according to claim 1, wherein the die hole penetrates the synthesized diamond layers in a plane that is substantially parallel to the bonding surface.

4. The wire drawing die according to claim 3, wherein the die hole has a center line which is located in proximity of or on the bonding surface.

5. A synthesized diamond according to claim 1, wherein the die hole penetrates the diamond layers in a plane that is perpendicular to the bonding surface.

* * * * *